United States Patent

Wu et al.

[11] 3,976,377
[45] Aug. 24, 1976

[54] METHOD OF OBTAINING THE DISTRIBUTION PROFILE OF ELECTRICALLY ACTIVE IONS IMPLANTED IN A SEMICONDUCTOR

[75] Inventors: Chung Pao Wu, Trenton; Edward Curtis Douglas, Princeton Junction; Charles William Mueller, Princeton, all of N.J.

[73] Assignee: RCA Corporation, New York, N.Y.

[22] Filed: Feb. 3, 1975

[21] Appl. No.: 546,778

[52] U.S. Cl. .............................. 356/36; 324/158 R; 324/158 D
[51] Int. Cl.² .................... G01B 9/02; G01R 31/26
[58] Field of Search ........ 324/158 D, 158 R, 158 T; 356/36

[56] References Cited
UNITED STATES PATENTS
3,424,532   1/1969   Briggs et al. .......................... 356/36

OTHER PUBLICATIONS
Glendinning et al.; IEEE Trans on Parts, Materials, and Packaging; vol. PMP-6; No. 3; Sept. 1970, pp. 93–99.

*Primary Examiner*—R. V. Rolinec
*Assistant Examiner*—Ernest F. Karlsen
*Attorney, Agent, or Firm*—H. Christoffersen; Robert P. Williams; Thomas H. Magee

[57] ABSTRACT

A method of obtaining a distribution profile of electrically active ions, of one type conductivity, implanted into a semiconductor, of an opposite type conductivity, is carried out with the aid of an integral target of the semiconductor. The integral target is formed with a plurality of doped regions of different background impurity concentrations, respectively, therein. Each of the operations of annealing, angle-lapping, and staining the doped regions to determine P-N junction depths therein is carried out on all of the doped regions simultaneously. An enlarged photograph of the stained angle-lapped portions of the doped regions provides directly a histogram of the distribution profile.

10 Claims, 5 Drawing Figures

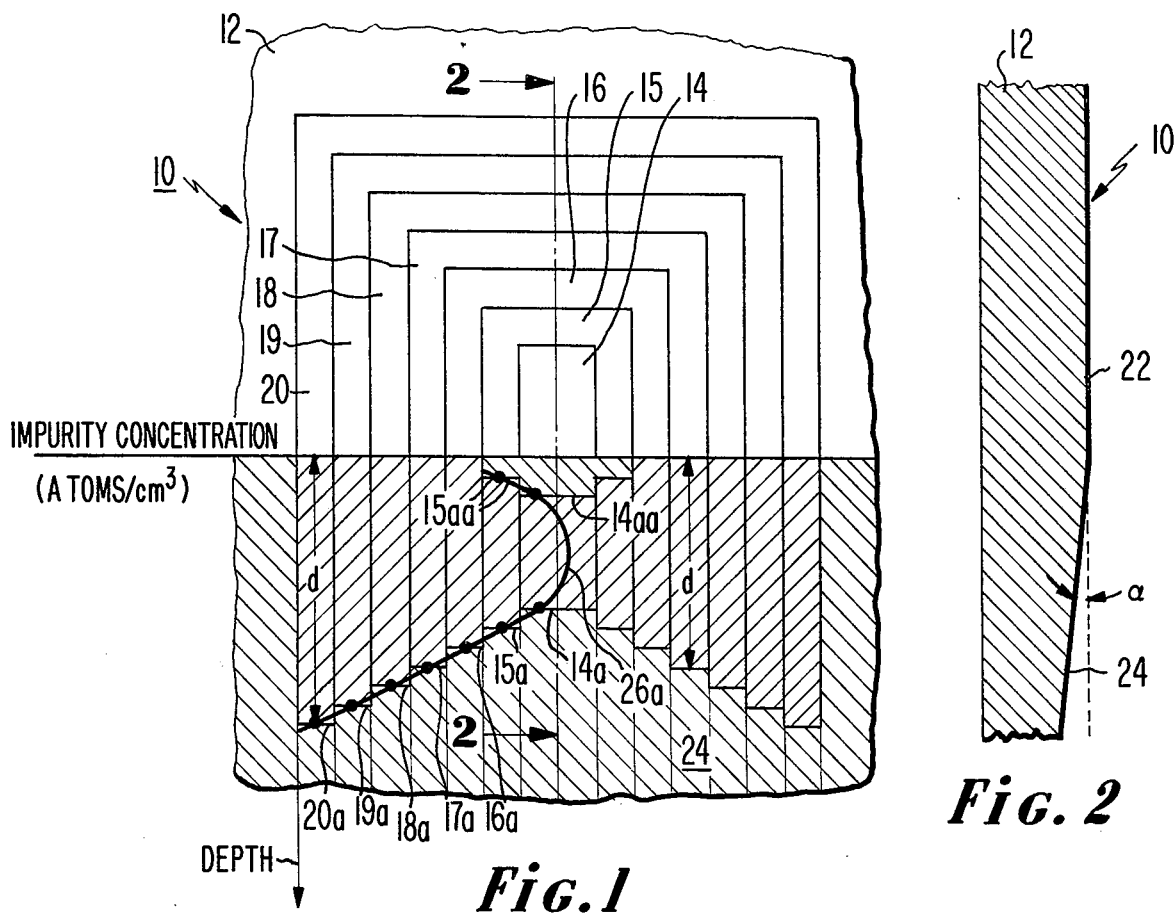
*Fig. 1*
*Fig. 2*
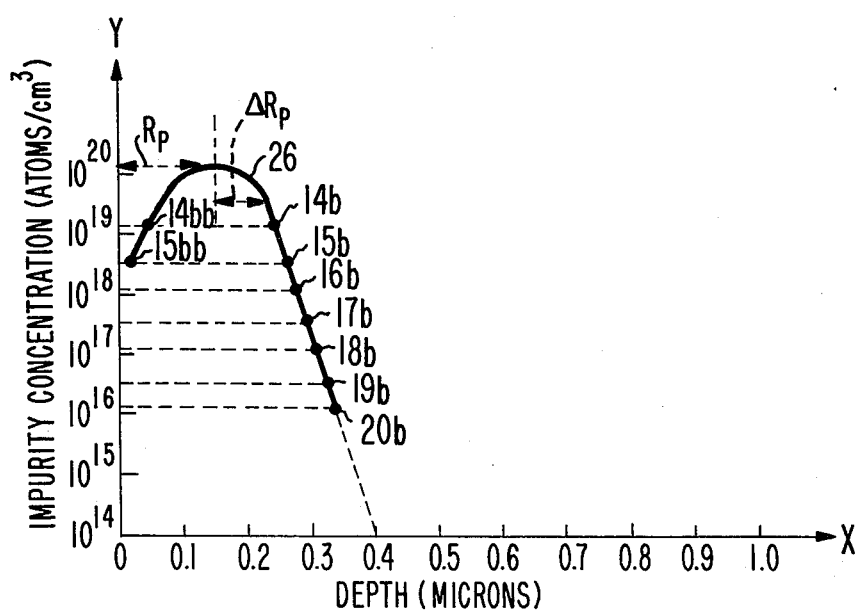
*Fig. 3*

METHOD OF OBTAINING THE DISTRIBUTION PROFILE OF ELECTRICALLY ACTIVE IONS IMPLANTED IN A SEMICONDUCTOR

This invention relates to a method of obtaining the distribution profile of electrically active ions implanted in a semiconductor. More particularly, the invention relates to a method of obtaining the distribution profile of electrically active ions, of one-type conductivity ion, implanted into a semiconductor of an opposite-type conductivity.

Categorically, there are four methods commonly used for obtaining electrically active profiles of ions implanated in a semiconductor material: (a) the two-point probe resistivity measurement method, (b) the C-V profiling method, (c) the resistivity or Hall-voltage method coupled with a successive anodization and stripping techniques, and (d) the P-N junction location method.

The two-point probe resistivity measurement method fails for shallow profiles which are less than one micron in depth because of the relatively large size of the point probes when compared to the profile. The C-V profiling method can introduce fictitious tails in the distribution curve for abrupt profiles so that junction depths obtained can be erroneous. The resistivity or Hall-voltage method coupled with successive anodization and stripping is very tedious and time-consuming, as well as inaccurate when close to the junction region, the most important portion of electrically active profile.

In the known PN junction location method, the distribution profile has been determined by measuring the depths at which P-N junctions were formed when ions of one conductivity type were implanted into a plurality of separate targets of different background impurity concentrations, respectively, of the opposite conductivity type. After ion implantation and annealing, each target contained a P-N junction located at a depth at which the concentration of electrically active implanted ions equaled the background impurity concentration of the target. Separate angle-lapping and staining operations were used to locate the P-N junction depth in each of the separate targets.

In the prior art, the P-N junction location technique has yielded poor results, largely because of the systematic errors in the operations of angle-lapping and staining the separate targets, and in providing a plurality of accurately prepared targets with known background impurity concentrations. The latter disadvantages are either eliminated or substantially reduced in the novel method of the present invention.

The novel method of obtaining the distribution profile of electrically active ions implanted in a semiconductor is carried out with the aid of an integral target. The integral target comprises a single wafer of semiconductor material of one type conductivity having a plurality of doped regions of different impurity concentrations, respectively, formed therein. Each of the doped regions has a surface that comprises a portion of the surface of the integral target. The distribution profile is obtained by ion implanting the electrically active ions, of an opposite conductivity to that of the integral target, into the integral target and observing the P-N junctions in each of the doped regions. An enlarged photograph of an angle-lapped, stained portion of the integral target, showing the P-N junctions, provides directly a histogram of the desired distribution profile.

The novel method will be explained with the aid of the accompanying drawings in which:

FIG. 1 is a plan view of an integral target of semiconductor material, formed with a plurality of doped regions arranged concentrically, and showing stained P-N junctions in an angle-lapped portion of the target;

FIG. 2 is a cross-sectional view taken along the line 2—2 shown in FIG. 1, and viewed in the direction indicated by the arrows;

FIG. 3 is a distribution profile illustrated as a semilogarithmic plot; and

Figure 4:
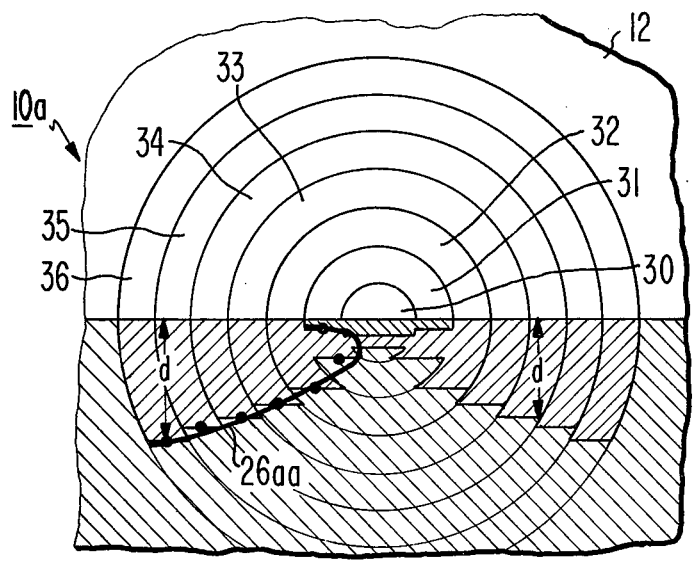
FIGS. 4 and 5 are plan views of integral targets in other embodiments thereof.

Referring now to FIGS. 1 and 2 of the drawing, there is shown an integral target 10, in one embodiment thereof, comprising a single wafer 12 of a semiconductor, such as N-type silicon, for example. The target 10 may have a thickness of between about 0.25 and 0.50 mm and comprises a plurality of doped regions 14–20 of different background impurity concentrations, respectively. The doped regions 14–20 comprise relatively narrow strips, each having a width of about 10 $\mu$m, and arranged so that each of the strips has a portion that is parallel to a portion of the other strips. The doped regions 14–20 are also arranged so that they are in either an increasing or a decreasing order of background impurity concentration.

Ion implantation is used preferably to implant different known doses of background impurity concentrations into the doped regions 14–20 of the target 10. This can be achieved easily with conventional photolithographic masking techniques, well-known in the semiconductor manufacturing art. Thus, for example, starting with the wafer 12 of N-type conductivity and of a relatively low background concentration, (say about $7 \times 10^{14}$ cm$^{-3}$), the region 14, for example, is defined (exposed) by a photoresist and an etched silicon dioxide mask (layer) while the remaining regions 15–20 are covered (masked) with the silicon dioxide layer and the photoresist. The region 14 is then implanted with a known dose of N-type ions (e.g., phosphorus) of a known concentration. Next, both of the regions 14 and 15 are defined (exposed) together and the regions 16–20 are covered (masked, as explained supra). The regions 14 and 15 are next implanted with another known dose of similar ions of a known concentration. In a similar manner, the regions 16, 17, 18 and 20 are sequentially ion implanted with known doses of the same impurity so that background impurity concentrations of the regions 14–20 can be easily calculated and known. For example, the doped regions 14, 15, 16, 17, 18, 19, and 20 may have concentrations of $1 \times 10^{19}$ cm$^{-3}$, $3.2 \times 10^{18}$ cm$^{-3}$, $1 \times 10^{18}$ cm$^{-3}$, $3.2 \times 10^{17}$ cm$^{-3}$, $1 \times 10^{17}$ cm$^{-3}$, $3.2 \times 10^{16}$ cm$^{-3}$, and $1 \times 10^{16}$ cm$^{-3}$, respectively.

The doped regions 14–20 are sufficiently close to one another so that each of the operations of angle-lapping, and staining can be performed on all of these doped regions 14–20 simultaneously to reveal P-N junctions in a manner to be hereinafter explained.

After the doped regions 14–20 of different background impurity concentrations are formed, they are capped i.e., covered with a layer of silicon dioxide and annealed to provide a substantially flat uniform background impurity concentration in these regions. The annealing operation is carried out simultaneously on all of the doped regions 14–20 at a temperature of about 1100°C for about 6 hours to achieve a substantially uniform background impurity concentration of a depth of at least 1 micron in the doped regions 14–20. After the annealing operation, the capping layer of silicon dioxide is removed, as by etching in a manner well known in the semiconductor art, and the integral target 10 is ready for use.

In carrying out the novel method, the integral target 10 of one type conductivity is placed in the target chamber of an ion-implanted machine, and each of the doped regions 14–20 is implanted with ons of an opposite type conductivity under identical conditions. Although the target 10 has been described and illustrated as having seven doped regions 14–20 of different (increasing or decreasing) background impurity concentrations, respectively, the target 10 may contain preferably from between about 5 and 15 doped regions, for example, depending on the number of plotting points desired for the distribution profile.

After the target 10 has been ion implanted with electrically active ions (e.g., boron) of an opposite (P) type conductivity to that of the (N-type) target 10, the target 10 should be annealed under the same conditions as those of the devices (materials) whose distribution profile it is desired to obtain. Each of the doped regions 14–20 now contains a P-N junction located at a depth at which the concentration of electrically active implanted ions equals the background impurity concentration of the region. The P-N junction depth in each of the doped regions 14–20 can be measured by the conventional angle-lapping and staining techniques well-known in the semiconductor art. Thus, each of the doped regions 14–20 provides one of the points on the desired distribution profile, shown in FIG. 3.

In accordance with the novel method of the present invention, all of the doped regions 14–20 of the integral target 10 can be angle-lapped simultaneously in a single operation. In angle-lapping the target 10, a portion of the surface 22 of the target, which also includes a portion of the surfaces of the doped regions 14–20, is angle-lapped, transversely to the doped regions 14–20, to form a dihedral angle $\alpha$, preferably of between about ½° and 5°, between the lapped portion 24 of the wafer 12 and an extension of the surface 22, as shown in FIG. 2.

By subjecting the portion 24 of the wafer 12, to a suitable staining operation, as with a dilute solution of $H_3PO_4$ for P-type silicon or a dilute solution of copper sulphate for N-type silicon in a manner well known in the art, the junction depths of the P-N junctions formed in the doped regions 14–20 can be delineated. The staining operation only stains one type conductivity, and hence, the P-N junctions 14a–20a formed in the doped regions 14–20, respectively, can be obtained as shown in FIG. 1. Suitable stains for each type conductivity (N or P) are well known in the art. By measuring the distance ($d$) along the angle-lapped portion 24 of the wafer 12, as the distance of a P-N junction from the vertex of the angle $\alpha$, the P-N junction depth ($x$) can be easily calculated as ($d \sin \alpha$). Any other means, known in the art, for measuring the P-N junction depth ($x$) may also be used. Hence, each of the doped regions 14–20 provides information relating to the P-N junction depth ($x$) for a particular background impurity concentration ($y$).

Points can be plotted as a semilogarithmic plot, as shown in FIG. 3, to obtain the distribution profile of the implanted ions in the semiconductor target. The points 14b–20b (FIG. 3) derived from the P-N junction depths ($x$) and background impurity concentrations ($y$) of the doped regions 14–20, respectively, determine the distribution profile 26 shown in FIG. 3. It will be noted that in regions of high background impurity concentration, such as in the doped regions 14 and 15 of some semiconductors, two P-N junctions 14a, 14aa and 15a, 15aa, respectively, are formed when certain ions are ion implanted therein. This occurs when the mean range $R_P$ of the implanted ions in the semiconductor material is larger than the straggle, $\Delta R_P$, of the implanted ions in the semiconductor material, where, as shown in FIG. 1, $R_P$ is the depth of the implanted ions at the maximum background impurity concentration, and $\Delta R_P$ is the lateral spread in the implanted ion distribution profile measured at 0.607 of the maximum concentration of the distribution profile. The points 14bb and 15bb, derived from the P-N junction depths 14aa and 15aa, respectively, are illustrated in the distribution profile 26.

An important feature of the novel method is obtaining the desired distribution profile quickly and directly by making an enlarged photograph of the stained and angle-lapped portion of the integral target, and interconnecting the midportions of the P-N junctions to obtain the distribution profile. Thus, if the widths of the doped regions 14–20 are substantially equal, and parallel, an enlarged photograph of the angle-lapped stained portion 24 of the integral target 10 looks like the portion 24 shown in FIG. 1. The vertex of the dihedral angle $\alpha$ can represent a line for indicating (logarithmically) the background impurity concentration of each of the doped regions 14–20; and a line substantially perpendicular to the vertex of the angle $\alpha$ can be used to represent the depth (linearly) of each of the P-N junctions. A curve 26a drawn through the midpoints of the P-N junctions in each of the regions 14–20 is the desired distribution profile. Thus, curve 26a in FIG. 1 is a semilogarithmic curve of the desired distribution profile, and is substantially the same as the curve 26 shown in FIG. 3.

Referring now to FIG. 4, there is shown a novel target 10a, in another embodiment of the integral target of the present invention. The target 10a is formed in substantially the same manner as the target 10 in FIG. 1 except for the fact that the progressively doped regions 30–36 in the target 10a are formed in strips of concentric circles instead of the concentric rectangles shown in FIG. 1.

Figure 5:
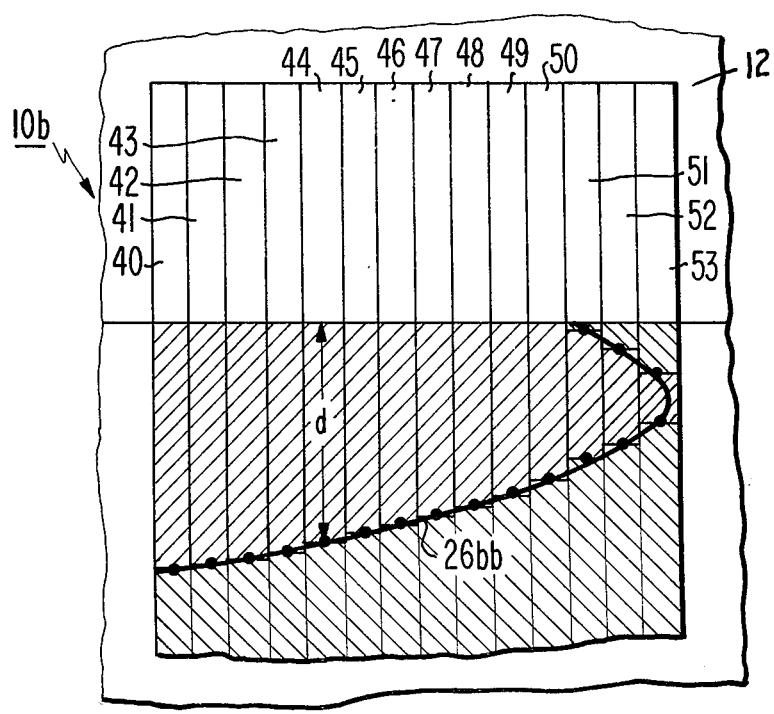

FIG. 5 shows a target 10b constructed in the same manner described for the construction of the target 10 in FIG. 1 except that the target 10b has a plurality of doped regions 40–53 produced by implanting ion impurities in parallel strips. The background impurity concentrations in the doped regions 40–53 increase progressively from the region 40 to the region 53.

Each of the targets 10a and 10b is shown with a portion of it angle-lapped and stained to demonstrate the P-N junctions resulting from ion-implanting ions of one type conductivity into a target of a semiconductor of an opposite type conductivity.

By making enlarged photographs of the targets 10a and 10b, after angle-lapping and staining, the photographs look substantially like the FIGS. 4 and 5, respectively. By connecting the midpoints of the P-N junctions (in the stained histogram) in each of the doped regions, distribution profiles are obtained, such as the curve 26aa in FIG. 4 and the curve 26bb in FIG. 5.

Hence, it is understood that from each of the novel targets 10, 10a, and 10b, a histogram in the angle-lapped stained portion can be provided photographically from which a desired distribution profile of electrically active ions can be drawn directly.

What is claimed is:

1. In a method of obtaining the distribution profile of electrically active ions implanted into a semiconductor, the improvement comprising:

providing an integral target of said semiconductor having a plurality of doped regions of different known background impurity concentrations of one type conductivity, respectively, formed therein, each of said doped regions having a substantially uniform background impurity concentration and having a surface comprising a portion of the surface of said integral target, and ion implanting ions of an opposite type conductivity through the surface of said integral target and simultaneously into each of said doped regions to form a P-N junction in each of said doped regions.

2. The improvement as described in claim 1, wherein:

said plurality of doped regions of different background impurity concentrations are formed substantially parallel to each other in said integral target of said semi-conductor, whereby said plurality of doped regions can be respectively annealed simultaneously, angle-lapped simultaneously, and stained simultaneously.

3. The improvement as described in claim 1, wherein:

said plurality of doped regions of different background impurity concentrations are formed sequentially, by ion implantation, in said integral target to provide an orderly arrangement of said doped regions of either increasing or decreasing resistivity in at least a part of said integral target.

4. The improvement as described in claim 1, wherein:

each of said doped regions has a portion thereof substantially parallel to portions of the other doped regions, and said doped regions are concentrically disposed in said integral target.

5. The improvement as described in claim 1, including the additional step of:

measuring the P-N junction depth ($x$) of each of said P-N junctions, in each of said doped regions of different background impurity concentration ($y$), whereby each doped region provides one point ($x,y$) of said distribution profile.

6. The improvement as described in claim 5, wherein the step of measuring the P-N junction depth ($x$) for each of said P-N junctions comprises angle-lapping a portion of said integral target transversely to the surfaces of all of said regions simultaneously to form a single shallow dihedral angle ($\alpha$) with the plane of the surface of said integral target and to expose the P-N junction in each of said doped regions.

7. The improvement as described in claim 6, wherein:

the step of measuring the P-N junction depth ($x$) of each of said P-N junctions comprises, in addition, staining the angle-lapped portion of said integral target to delineate the P-N junctions, and measuring the distance ($d$) of each P-N junction from the vertex of said angle ($\alpha$), whereby to obtain the P-N junction as $d \sin \alpha$.

8. The improvement as described in claim 1, wherein said doped regions have substantially the same widths, are adjacent and parallel to each other, and are arranged in said integral target in either an increasing or decreasing order of resistivity, the additional steps of:

angle-lapping a portion of said integral target transversely to the surfaces of all of said doped regions simultaneously to expose the P-N junction in said doped regions, staining the angle-lapped portion of said integral target to delineate the P-N junctions simultaneously, and making an enlarged photograph of the stained angle-lapped portion of said integral target, whereby to provide directly a picture of a histogram of said electrically active ions bounded by said P-N junctions, a midpoint of each P-N junction providing a point on said distribution profile so that said distribution profile may be drawn on said photograph.

9. A method of obtaining the distribution profile of electrically active ions implanted in a semiconductor comprising the steps of:

providing an integral target of said semiconductor having a plurality of doped regions of different known background impurity concentrations of one type conductivity, respectively, formed therein, each of said doped regions having a substantially uniform background impurity concentration, implanting ions of an opposite type conductivity into said doped regions of said target to form a P-N junction in each of said doped regions, annealing said doped regions of said target simultaneously, angle-lapping a portion of said target transversely to said doped regions to form a shallow dihedral angle with the plane of the surface of said target and to expose the P-N junction in each of said regions simultaneously, staining the angle-lapped portion, including all of said doped regions, of said target to delineate simultaneously the P-N junctions in said doped regions in the form of a histogram, and obtaining plotting points for said distribution profile from said histogram.

10. A method as described in claim 9, wherein said doped regions are of substantially the same widths, are adjacent and parallel to each other, and are arranged in said integral target in either an increasing or decreasing order of resistivity, the steps of obtaining plotting points for said distribution profile comprises:

making an enlarged photograph of the stained angle-lapped portion of said integral target, whereby to provide directly a picture of a histogram of said electrically active ions bounded by said P-N junctions, a midpoint of each P-N junction providing a point on said distribution profile so that said distribution profile may be drawn on said photograph.

* * * * *